INVENTORS
MINORU ONO
TOSHIMITU MOMOI

BY Craig, Antonelli, Stewart & Hill
ATTORNEYS

INVENTORS
MINORU ONO
TOSHIMITU MOMOI

BY Craig, Antonelli, Stewart & Hill
ATTORNEYS 3,788,913

SILICON NITRIDE ON SILICON OXIDE COATINGS FOR SEMICONDUCTOR DEVICES

Minoru Ono, Kodaira, and Toshimitu Momoi, Tokyo, Japan, assignors to Hitachi, Ltd., Tokyo, Japan Original application Jan. 31, 1968, Ser. No. 701,988, now abandoned. Divided and this application Aug. 20, 1970, Ser. No. 65,383
Claims priority, application Japan, Feb. 3, 1967, 42/6,608, 42/6,609
Int. Cl. H01l 7/50
U.S. Cl. 156—11 5 Claims

ABSTRACT OF THE DISCLOSURE

A method of manufacturing a semiconductor device wherein a silicon nitride film covers the exposed surfaces of an oxide film and the exposed major surface of a semiconductor body, and wherein holes are formed by chemical etching only in the portion of said silicon nitride film directly contacting said major surface, thereby obtaining precise etching of the insulating covering.

This is a division of application Ser. No. 701,988, filed on Jan. 31, 1968, now abandoned.

BACKGROUND OF THE INVENTION

Field of the invention

This invention relates to a technique of passivating a semiconductor device with silicon compounds.

Description of the prior art

Generally, in a unit circuit element like a transistor, a diode, a semiconductor resistor, a capacitor, etc. or in a so-called integrated semiconductor device like an integrated circuit device composed by assembling many such circuit elements as described above, interconnecting the same and providing outgoing lead terminals thereto, the surfaces thereof and the parts which particularly affect the characteristics thereof, e.g. the PN junction parts, the part nearby which becomes a space charge layer, the region operating due to the diffusion of minority carriers, etc. are covered with a passivation film such as an $SiO_2$ film because the characteristics of the elements or devices are altered by the influence of external moisture, conducting materials, ionic materials or the like.

Most passivation films which have been formed directly on a semiconductor substrate have been made of silicon dioxide. Silicon dioxide has the advantage of having a small increment of surface electron density. However, if metallic ions, such as sodium ions are present in the film the characteristics of the film are not stable. This instability is caused by the fact that ionic materials, such as sodium ions, migrate in the $SiO_2$ films at a relatively low temperature, for example, above 100° C. This migration is remarkably forced or enhanced by the application of an electric field. Thus, the characteristics of the film change during operation at high temperatures. Therefore, it is desirable to form $SiO_2$ passivation films free of harmful ions such as sodium ions.

Recently nitrides, such as $Si_3N_4$, have been developed as a substitute for $SiO_2$. It has been found that the increment of the surface electron density of silicon nitride is higher than that for $SiO_2$ film. The former films have an increment of surface electron density of $3\times10^{12}$ electrons/cm.$^2$, whereas the latter have an increment of $3\times10^{11}$ electrons/cm.$^2$. However, the migration of ionic materials, such as sodium ions, in the $Si_3N_4$ passivation films is quite small.

In an attempt to overcome the above-described defects, a semiconductor device comprising a double layer passivation film consisting of a lower layer of silicon oxide and an upper layer of silicon nitride has been proposed. In the production of such a semiconductor device, however, if a hole is provided in the double film by an etching step, excessive etching or side etching of the lower silicon oxide layer occurs due to a difference in etching rate between the silicon oxide and the silicon nitride, thereby rendering the fabrication of the device difficult.

SUMMARY OF THE INVENTION

An object of this invention is to provide a method for producing a novel stabilized semiconductor device covered with silicon compound films.

A further object of this invention is to provide a method of preventing the undesired influence caused by the side etching and thereby forming multiple layers of passivation films comprising a silicon oxide film and a silicon nitride film on a semiconductor surface.

A yet further object of the invention is to provide a method of producing a semiconductor device having excellent characteristics whose variation is small, wherein an $SiO_2$ layer, whose tendency to become N type is relatively small, is used as a first passivation layer for the semiconductor, and wherein an $Si_3N_4$ layer, in which the tendency of ion movement is relatively small, is formed thereupon as a second passivation layer, the combined passivation layers precluding the entrance of ions, such as $Na^+$, from outside and enabling the surface of the substrate to have a low tendency to become of N conductivity type.

According to an embodiment of this invention, the semiconductor device of the invention is provided in the following way.

(1) An $SiO_2$ layer is formed partially on a semiconductor surface. Such an $SiO_2$ layer is formed by a method wherein the silicon semiconductor surface is oxidized at a high temperature, a method utilizing $SiO_2$ formed at the time of impurity diffusion, or a method wherein $SiO_2$ is deposited on a semiconductor by thermally decomposing organo-oxysilane or the like. And then the $SiO_2$ layer is selectively etched by ordinary methods.

(2) Then, an $Si_3N_4$ layer is deposited both on the $SiO_2$ layer and on a substrate surface not covered with the $SiO_2$ layer by reacting $SiH_4$ gas and $NH_3$ gas at about 700° C.–1000° C., using $N_2$ gas as a carrier gas.

(3) A hole for electrode formation is then provided through a portion of the $Si_3N_4$ layer which does not cover the $SiO_2$ layer. The hole is provided by known photoetching techniques.

(4) The semiconductor wafer treated in this way is cut into respective elements to provide a completed semiconductor element.

DESCRIPTION OF THE PREFERRED EMBODIMENTS

Figure 1A:
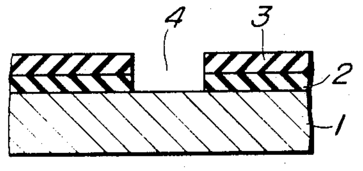
FIGS. 1*a* and 1*b* are sectional diagrams showing a semiconductor wafer according to the prior art.
Figure 1B:
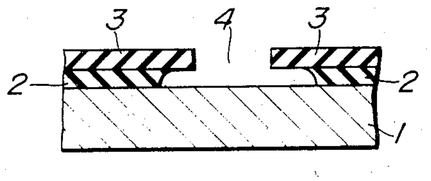

For a better understanding of this invention, a conventional example will be briefly depicted with reference to the accompanying drawings. As shown in FIG. 1*a*, according to a conventional example, an $SiO_2$ layer 2 is formed on a silicon semiconductor substrate 1 and an $Si_3N_4$ layer 3 is formed on the $SiO_2$ layer 2. Thus, a double passivation film structure is composed so as to provide both of the advantages of the two surface stabilization passivation films. Then, the $Si_3N_4$ and $SiO_2$ films are partially etched away with a hydrofluoric acid etchant to form an opening 4 through which an electrode is connected to the silicon semiconductor substrate. However, since the chemical properties of the two films differ from each other, the etching speed is different and the opening 4 is etched excessively in a transverse direction and shaped inside in the region of the $SiO_2$ layer as shown in the enlarged drawing of FIG. 1*b*. Accordingly, moisture, etc. is likely to adhere to the gap in the $SiO_2$ layer and to seriously influence the electrical properties of the device involved. Further, when an electrode is to be established from the semiconductor surface through the passivation film, the electrode may not be connected at the gap part and, even if connected, the connection may become very weak. In a double passivation film of $SiO_2$-$Si_3N_4$ according to this invention, the $Si_3N_4$ exhibits a slower etching speed than $SiO_2$ and the relation of the etching speed in this system is the reverse of the relation of etching speed in a conventionally known $SiO_2$-glass double passivation film. Thus, etching techniques to be applied to known double passivation films cannot be utilized. Therefore, this invention provides an etching method which is effective when applied in a case where a first film ($SiO_2$) is etched with an etchant which etches a second film ($Si_3N_4$) as described hereinabove and the etching speed of the first film is larger than that of the second film. According to this method, a stabilized semiconductor device is provided.

Figure 2A:
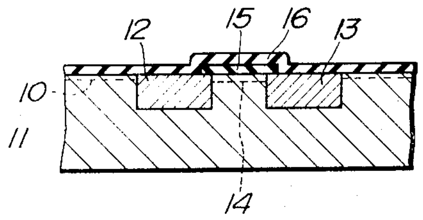
FIGS. 2*a* and 2*c* are sectional diagrams showing a semiconductor wafer comprising an MOS type field effect transistor (MOS FET) according to an embodiment of this invention.
Figure 2B:
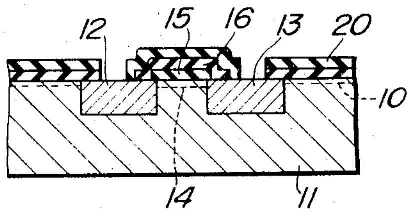
Figure 2C:
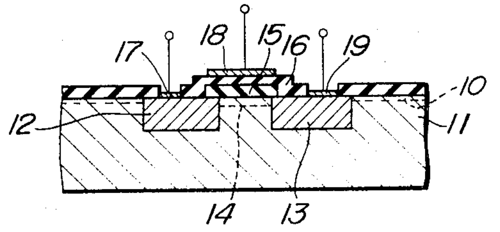

Now, a method of making an MOS FET will be described hereinbelow in conjunction with FIGS. 2*a* to 2*c* as an embodiment of this invention.

On a P type silicon semiconductor substrate 11, an N type source region 12 and an N type drain region 13 are formed and an $SiO_2$ film 15 of 1000–2000 A. is provided on the substrate between these two regions. The film 15 induces an N type channel 14 on the substrate surface between the regions. After such a body is prepared, silane and ammonia are reacted at about 700–1000° C., using $N_2$ gas as a carrier gas, to form an $Si_3N_4$ film 16 of 500–1000 A. in a thickness on the surface of the film 15 and the substrate surface. This state is shown in FIG. 2*a*. Then, as shown in FIG. 2*b*, the $Si_3N_4$ film provided on a part of the surfaces of the source region 12 and the drain region 13 is exposed to etchant, for example, hydrofluoric acid by using a corrosion resistive mask 20 provided by known photo-resisting techniques, e.g. a sensitized KPR film (KPR is a trademark of Kodak Co. Ltd.), thus exposing a portion of the source and drain regions. After the mask material 20 is eliminated, a source electrode 17, a gate electrode 18 and a drain electrode 19 are set. This state is shown in FIG. 2*c*. In the semiconductor passivation film provided in the above method. The $SiO_2$ film 15 which induces a channel layer and which is the most important part for the electrical characteristics of an MOS field effect transistor has all of its exposed surfaces covered with the $Si_3N_4$ film 16. That is, the entire $SiO_2$ film is enclosed and shielded from the surrounding atmosphere by the silicon nitride film 16 and the semiconductor substrate 11. Thus, at the part where the passivation film for surface stabilization ($Si_3N_4$ film) is partially etched away and at the part where the semiconductor surface is exposed, moisture or contamination materials are never captured and the electrical characteristics of the element can be made quite stable.

In the MOS FET shown in FIG. 2*c*, the leakage current between the source and drain regions may flow through the induced channel layer 10 below the single layer of $Si_3N_4$. However, the leakage current can be reduced substantially to zero by forming the gate electrode 18 and the channel layer 14 in a ring form surrounding the drain region 13, as known in a ring-gate type MOS FET. It is further to be noted that it is possible in this embodiment to make parts for setting electrodes on the source and drain regions into a single layer only and to form all the other parts into a double layer structure consisting of an $SiO_2$ film and an $Si_3N_4$ film.

Figure 3:
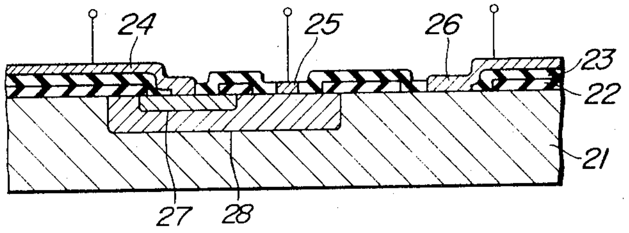
FIG. 3 is a sectional diagram showing a semiconductor substrate comprising a transistor structure according to another embodiment of the invention.

Now, another embodiment of the invention will be described below with reference to FIG. 3. This embodiment is provided by applying this invention to the manufacture of a surface stabilized bipolar transistor. A surface passivation film 22 of 3000–5000 A. consisting of $SiO_2$ is formed to cover and passivate PN junction terminations exposed on the surface of a semiconductor substrate 21 wherein PN junctions 27 and 28 of an emitter and a collector are formed, and on the other surface parts of the semiconductor, a surface passivation film 23 of 3000–4000 A. consisting of $Si_3N_4$ is provided. Then, parts of the $Si_3N_4$ film 23 necessary for electrode connections are eliminated and electrodes 24, 25 and 26 are connected thereto. In such a transistor, if an $Si_3N_4$ film is adhered directly to the termination of the PN junction, a strong N type channel layer is induced in the semiconductive surface at the vicinity of the PN junction termination by the $Si_3N_4$ film, and thereby the withstand voltage of the PN junction or the current amplification factor is lowered remarkably. However, when this invention is applied as in this embodiment, the damage of inducing a strong N-type channel is reduced and a semiconductor device whose electrical characteristics are quite stable can be obtained. It is needless to mention that this technique is not restricted to transistors, but can be applied to the surface stabilization of diodes, etc. to provide the same effect. Though the stability of the characteristics of the semiconductor element as shown in FIG. 3 is remarkably improved compared with that of the element covered only with an $SiO_2$ layer, a small variation of the characteristics is still observed during a long, high-temperature operation. An investigation of the cause therefor indicates that since the $SiO_2$ film is exposed on the side surfaces of the element when the semiconductor wafer is cut or separated by etching into elements, ionic materials, such as $Na^+$, enter through these parts especially in a high temperature state, move to the adjacent operating parts, such as the PN junction, and change the characteristics of the element. Therefore, in the preferred embodiments to be described below, a second film ($Si_3N_4$ in this embodiment) is formed on the first film in a way that the first film ($SiO_2$ in this embodiment) of said double film which contacts the semiconductor substrate may not be exposed at all. Now, such an embodiment will be described in conjunction with the accompanying drawings.

Figure 4A:
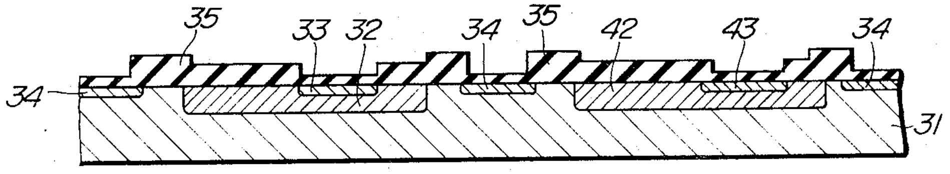
FIGS. 4*a* to 4*d* and FIG. 5 are sectional diagrams and a plan diagram of a semiconductor device according to a further embodiment of the invention.

FIG. 4*a* shows a semiconductor wafer 31 prepared for the application of this invention and N type base layers 32 and 42, $P^+$ type emitter layers 33 and 43 and a $P^+$ type annular layer 34 are formed by applying a diffusion technique to a P type semiconductor wafer 31 which becomes a collector. Reference numeral 35 designates an $SiO_2$ layer having a thickness of about 5000 A., which can be formed by various methods as described hereinabove, but in this embodiment, it indicates an $SiO_2$ layer provided by oxidizing the semiconductor surface at a high temperature. Such an $SiO_2$ layer includes a phospho-silicate glass layer thermally produced at the time of the diffusion treatment.

Figure 4B:
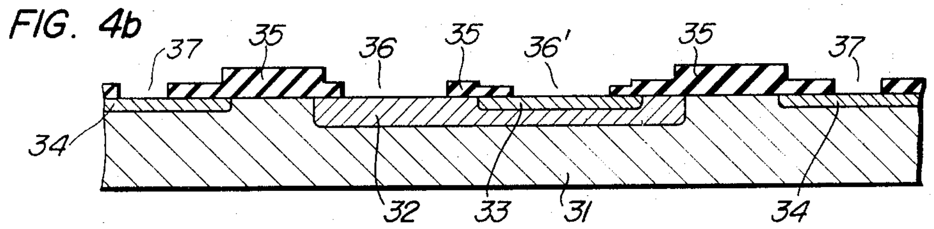

FIG. 4*b* shows the wafer shown in FIG. 4*a* in an enlarged way. The same figure shows the state after parts 36 and 36′ for placing an electrode in an $SiO_2$ layer 35 and a part 37 for separating the wafer into respective elements are etched away. The overall treatment was done with a single etching treatment according to a known photo-etching method called the photoresist mask etching method.

Figure 4C:
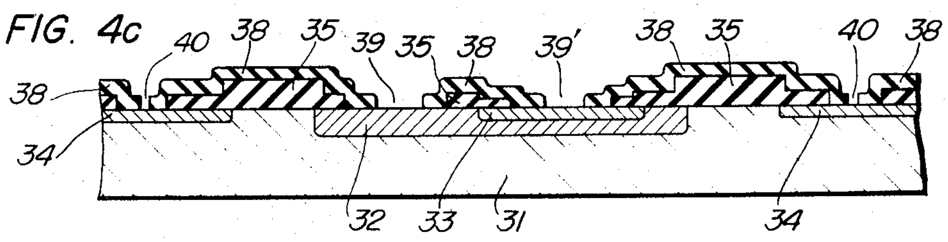

Then, as shown in FIG. 4c, an $Si_3N_4$ layer 38, a second layer, having a thickness of about 4000 A. is formed on the remaining $SiO_2$ layer and on the exposed semiconductor surface by such method and openings 39 and 39' for electrode formation, i.e. exposed semiconductor parts, are formed in that part of the $Si_3N_4$ layer which does not cover the $SiO_2$ layer by a similar photoetching method. Since the $Si_3N_4$ is difficult to etch, a fairly rigid material must be prepared as a mask material. Thus, a suitable mask may include a chromium layer (not shown) formed on the $Si_3N_4$ layer 38 in advance, the chromium layer being treated by a photoetching technique. The $Si_3N_4$ layer may then be etched by using the chromium layer as a mask. In this case, it is also possible to etch the other wafer part not covered with the $SiO_2$ layer, i.e. the $Si_3N_4$ layer 38 on the part to be cut as shown by a ditch 40 in FIG. 4c. Then, electrodes 41a and 41b, made e.g. of Al, are formed on the exposed semiconductor surfaces of the wafer.

Figure 5:
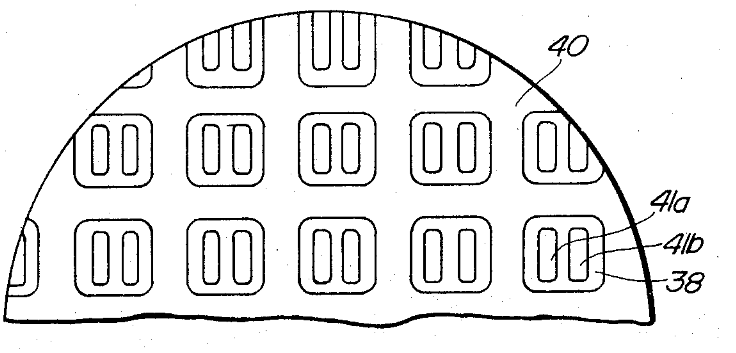

The upper part of the wafer is shown in FIG. 5. Ditches 40 are formed between the respective element parts on the wafer and thus, the apparent representation of the positions for separation is provided.

Figure 4D:
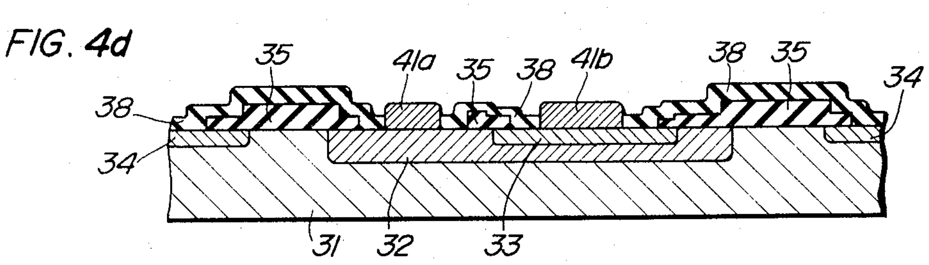

Then, the wafer is cut at the ditch parts by a mechanical or chemical method, etc. to provide respective completed elements as shown in FIG. 4d. In this case, by forming electrode materials in the ditch parts 40 at the time of forming the electrodes 41a and 41b, the possibility of Si powder generated in the process of wafer cutting adhering to the wafer surface (generally, it adheres electrostatically) and damaging the passivation film can be prevented. Further, if such electrode materials have the property of preventing a channel layer from being induced on the semiconductor surface part (the Al prevents an N type channel), the formation of the annular ring diffused layer can be dispensed with.

As is evident from the foregoing description of the invention, when the surface is to be protected with a multiple passivation film according to this invention, the inner passivation film, $SiO_2$ film, is not exposed outside, and a complete surface passivation film is provided.

Figure 6:
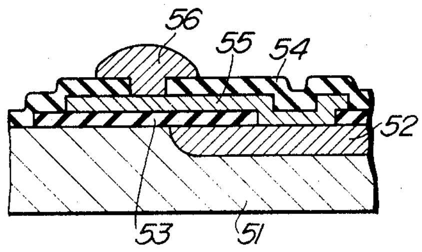
FIG. 6 is a fragmentary sectional diagram of a modified embodiment of the invention.

Therefore, it is evident that this invention can be applied to the formation of a double or a multiple passivation film composed of known materials, etc. in addition to the $SiO_2$-$Si_3N_4$ double passivation film described hereinabove. It is further possible to derive electrodes, as shown in FIG. 6, by providing an opening in an $SiO_2$ film 53, deriving a first electrode 55 from the surface of a semiconductive substrate 51 over the $SiO_2$ film 53 through said opening, forming a $Si_3N_4$ film 54 in a way to expose the first electrode 55 on the $SiO_2$ film 53 and connecting a second electrode 56 to the first electrode 55 through this opening. In addition, since the $SiO_2$ film 53 is perfectly covered with the $Si_3N_4$ film 54 there is no danger that $Na^+$ ions will enter into the $SiO_2$ film from external sources.

What is claimed is:

1. A method of making a semiconductor device comprising the steps of:

(a) preparing a semiconductor substrate comprising a principal surface having a predetermined portion thereof covered with a first insulating film consisting mainly of silicon dioxide;

(b) covering substantially the entire exposed surface of said first film and said principal surface of said substrate not covered with the first film with a second insulating film consisting mainly of silicon nitride;

(c) completely covering said first and second films, except for a portion of said second film directly contacting the surface of said semiconductor substrate at a location spaced from the portion of said surface covered with said first insulating film, with a corrosion resistive mask; and (d) exposing the combination thus composed to an etchant to partially etch away the portion of said second insulating film not covered with said corrosion resistive mask so as not to expose said first insulating film.

2. A method according to claim 1, wherein said etchant includes hydrofluoric acid.

3. A method according to claim 1, wherein said corrosion resistive mask is composed of chromium.

4. A method for manufacturing a semiconductor device, comprising the steps of:

covering a semiconductor wafer, having a plurality of semiconductor portions spaced from each other, with a silicon dioxide film;

selectively removing said silicon dioxide film so as to expose the surfaces of said semiconductor portions and to divide said silicon dioxide film into a plurality of islands, the islands of the silicon dioxide film being spaced from each other;

covering, directly, with an insulating film consisting essentially of silicon nitride, the entire exposed surfaces of said semiconductor portions and the entire exposed surfaces of said silicon dioxide film;

covering, with a corrosion resistive mask, said silicon nitride film;

selectively removing the portions of said corrosion mask formed on the portion of said silicon nitride film which directly covers said surfaces of said semiconductor portions; and then exposing the combination thus composed to an etchant, to etch away the portions of said silicon nitride film not covered with said corrosion resistive mask.

5. A method of making a semiconductor device comprising the steps of:

preparing a semiconductor substrate comprising a principal surface having a predetermined portion thereof covered with a first insulating film of silicon dioxide;

covering at least a portion of the exposed surface of said first film and at least a portion of said principal surface of said semiconductor substrate not covered with said first film with a second insulating film of silicon nitride;

completely covering said first and second films, except for a portion of said second film directly contacting the surface of said semiconductor substrate at a location spaced from the portion of said surface covered with said first insulating film, with a corrosion resistive mask of chromium;

photo-etching said chromium mask to provide a mask on said silicon nitride film; and exposing the combination thus composed to an etchant of hydrofluoric acid to partially etch away the portion of said silicon nitride insulating film not covered with said chromium corrosion resistive mask.

References Cited

UNITED STATES PATENTS

| | | | |
|---|---|---|---|
| 3,193,418 | 7/1965 | Cooper et al. | 148—189 |
| 3,541,676 | 11/1970 | Brown | 29—571 |
| 3,519,504 | 7/1970 | Cuomo | 148—187 |
| 3,597,667 | 8/1971 | Horn | 317—234 |

WILLIAM A. POWELL, Primary Examiner

U.S. Cl. X.R.

156—13, 17